United States Patent
Chaudhary et al.

(10) Patent No.: US 9,401,442 B2
(45) Date of Patent: Jul. 26, 2016

(54) TEXTURED MICROMETER SCALE TEMPLATES AS LIGHT MANAGING FABRICATION PLATFORM FOR ORGANIC SOLAR CELLS

(75) Inventors: Sumit Chaudhary, Ames, IA (US); Kai-Ming Ho, Ames, IA (US); Joong-Mok Park, Ames, IA (US); Kanwar Singh Nalwa, Hillsboro, OR (US); Wai Y. Leung, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 777 days.

(21) Appl. No.: 13/223,351

(22) Filed: Sep. 1, 2011

(65) Prior Publication Data
US 2012/0048368 A1    Mar. 1, 2012

Related U.S. Application Data

(60) Provisional application No. 61/379,129, filed on Sep. 1, 2010.

(51) Int. Cl.
| | | |
|---|---|---|
| *H01L 31/0232* | (2014.01) | |
| *H01L 31/0224* | (2006.01) | |
| *H01L 31/0236* | (2006.01) | |
| *B82Y 10/00* | (2011.01) | |
| *H01L 51/44* | (2006.01) | |
| *H01L 51/00* | (2006.01) | |
| *H01L 51/42* | (2006.01) | |

(52) U.S. Cl.
CPC .............. *H01L 31/0236* (2013.01); *B82Y 10/00* (2013.01); *H01L 51/447* (2013.01); *H01L 51/0036* (2013.01); *H01L 51/0037* (2013.01); *H01L 51/0047* (2013.01); *H01L 51/4253* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 2007/0221911 A1* | 9/2007 | Van Mol et al. | 257/40 |
| 2009/0242019 A1 | 10/2009 | Ramamoorthy et al. | |
| 2009/0255586 A1 | 10/2009 | Kim et al. | |

(Continued)

OTHER PUBLICATIONS

Na et al, Surface relief gratings on poly(3-hexylthiophene) and fullerene blends for efficient organic cells, Applied Physics Letters 91, 173509 (2007).*

(Continued)

*Primary Examiner* — Marla D McConnell
(74) *Attorney, Agent, or Firm* — Reinhart Boerner Van Deuren P.C.

(57) ABSTRACT

A three-dimensional, microscale-textured, grating-shaped organic solar cell geometry. The solar cells are fabricated on gratings to give them a three-dimensional texture that provides enhanced light absorption. Introduction of microscale texturing has a positive effect on the overall power conversion efficiency of the devices. This grating-based solar cell having a grating of pre-determined pitch and height has shown improved power-conversion efficiency over a conventional flat solar cell. The improvement in efficiency is accomplished by homogeneous coverage of the grating with uniform thickness of the active layer, which is attributed to a sufficiently high pitch and low height of the underlying gratings. Also the microscale texturing leads to suppressed reflection of incident light due to the efficient coupling of the incident light into modes that are guided in the active layer.

25 Claims, 6 Drawing Sheets

(56) References Cited

U.S. PATENT DOCUMENTS

2010/0186798 A1* 7/2010 Tormen et al. .............. 136/246
2010/0186816 A1* 7/2010 Park et al. .................. 136/256

OTHER PUBLICATIONS

Kanwar S. Nalwa et al.; On Conformal Coating of Polymer Photovoltaic Layers on Light Trapping Textured Substrates; known at least as early as Sep. 1, 2011; 11 pages; Department of Electrical and Computer Engineering, Iowa State University, Ames, Iowa, USA.

Kanwar S. Nalwa et al.; On Realizing Higher Efficiency Polymer Solar Cells Using a Textured Substrate Platform; Materials Views/ Advanced Materials; 2010; 5 pages (1-5); vol. XX, 1-5; Wiley-VCH Verlag GmbH & Co. KGaA, Weinheim; Germany.

Lucimara Stolz Roman et al; Trapping Light in Polymer Photodiodes with Soft Embossed Gratings; Advanced Materials; 2000; 7 pages (189-195); vol. 12, No. 3; Wiley-VCH Verlag GmbH, Weinheim, Germany.

M. Niggemann et al.; Diffraction Gratings and Buried Nano-Electrodes—Architectures for Organic Solar Cells; Science Direct/This Solid Films 451-452; 2003; 7 pages (619-623); Elsevier B.V.

M. Niggemann et al.; Functional Microprism Substrate for Organic Solar Cells; Science Direct/Thin Solid Films 511-512; 2005; 6 pages (628-633); Elsevier B.V.

Shanbin Zhao et al.; An Effective Light Trapping Configuration for Thin-Film Solar Cells; Applied Physics Letters; Dec. 10, 2007; 4 pages; vol. 91, No. 24; American Institute of Physics.

Kanwar S. Nalwa et al.; Design of Light-Trapping Microscale-Textured Surfaces for Efficient Organic Solar Cells; Optics Express; Mar. 1, 2010; 11 pages (5168-5178); vol. 18, No. 5.

* cited by examiner

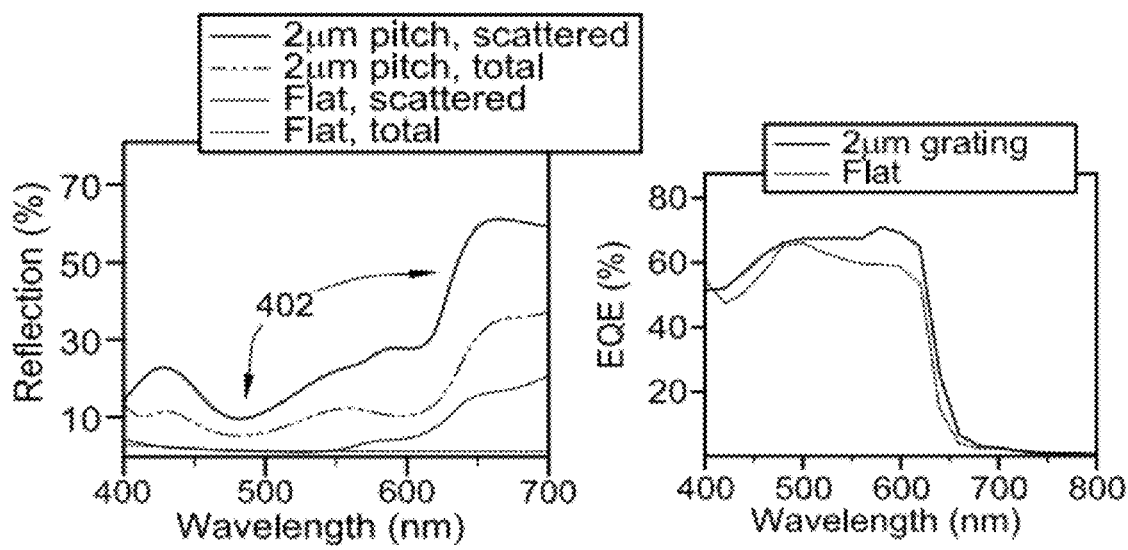
FIG. 4A
FIG. 4B
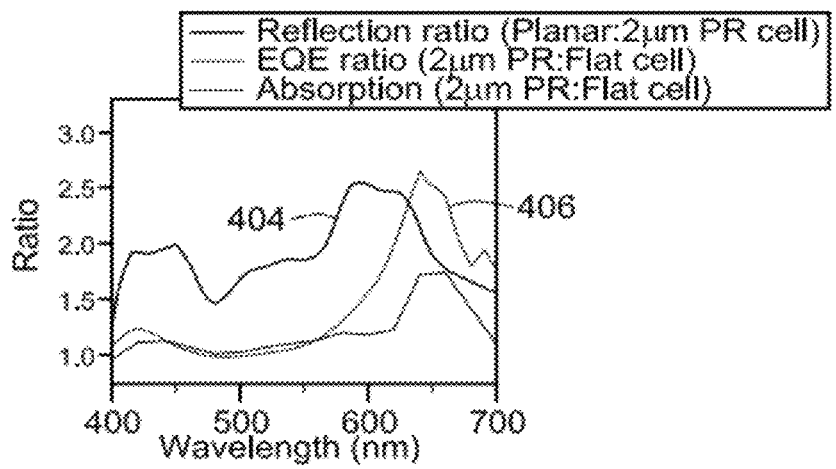
FIG. 4C

TEXTURED MICROMETER SCALE TEMPLATES AS LIGHT MANAGING FABRICATION PLATFORM FOR ORGANIC SOLAR CELLS

CROSS-REFERENCE TO RELATED PATENT APPLICATIONS

This patent application claims the benefit of U.S. Provisional Patent Application No. 61/379,129, filed Sep. 1, 2010, the entire teachings and disclosure of which are incorporated herein by reference thereto.

STATEMENT REGARDING FEDERALLY SPONSORED RESEARCH AND DEVELOPMENT

This invention was made in part with Government support under Grant Number DE-AC02-07CH11358 awarded by the Department of Energy. The Government has certain rights in this invention.

FIELD OF THE INVENTION

This invention generally relates to organic solar cells, and more particularly to light trapping techniques for use therewith.

BACKGROUND OF THE INVENTION

Organic solar cells (OSCs) have gained much attention in the past decade because they offer realization of low-cost solar energy conversion devices, with advantages including mechanical flexibility, light weight, ease of processing and large area roll-to-roll production. Most of the developments that have improved performance of OSCs are based on electron donor-acceptor heterojunctions, which deal with the photo-induced electron transfer from a donor conjugated polymer to an acceptor molecule. A revolutionary development in organic photovoltaics came in the mid-1990s with the introduction of a dispersed/bulk heterojunction (BHJ), where an electron accepting and an electron donating material are blended together at the length scale similar to the exciton diffusion length. The dissociation of excitons at the donor-acceptor interface leads to free electrons and holes which travel to the contacts, if continuous pathways exist in each material from the interface to the respective electrodes. The electron acceptors are often the fullerenes or the derivative [6,6]-phenyl-C61-butyric acid methyl ester (PCBM) having better miscibility in organic solvents. For OSCs with poly(3-hexylthiophene) (P3HT) as electron donor, highest efficiencies reaching up to 5% have been reported; however further improvement in efficiency is required for large scale commercialization and practical applications.

Among many factors, the crucial parameters that need to be taken into account for achieving high efficiency solar cells are the band gap for increased absorption, the photon-electron conversion rate and charge carrier mobility of the photoactive polymer. The high energy band gap of the polymer materials and weak absorbance poses a serious limitation on the capability to harvest sunlight. Moreover the charge carrier mobility of the materials is also moderate, which makes it necessary to keep the thickness of the active layer low to minimize recombination losses. Typical thicknesses of active layer in optimized BHJ devices is 100-200 nanometers (nm) due to the performance-limiting trade-off between optical absorption and electrical transport, which are adequate for visible light absorption owing to strong extinction coefficient in this wavelength range.

A significant portion of the solar flux lies beyond $\lambda=600$ nm, which is near the band edge of many BHJ materials. Recently many low-band gap polymers have been produced with broader absorption range to better harvest the solar spectrum, exhibiting efficiencies of over 5%. A few reports on these low-band gap polymers demonstrated internal quantum efficiency, IQE (fraction of collected carriers per absorbed photon) approaching 100%. However, these low-band gap polymers suffer from poor absorbance (fractional number of absorbed photons from the solar spectrum) in their absorption range, for thicknesses optimized for electrical performance. Hence absorbance of these low-band gap polymer based OSCs has to be improved, since it also governs the photocurrent generation, like IQE, and seeks attention to further push the power conversion efficiencies towards the desired 10% mark.

The constraints on active layer thickness of these OSCs make it imperative to develop light trapping schemes to enhance absorption in a specific spectral range with weak absorption without increasing photoactive layer thickness. Light management techniques in ray optics regimes, have been implemented for enhancement in optical absorption, e.g. collector mirrors, microprism substrates and V-folded configurations. Light trapping by means of a periodic patterning, has been achieved either by using a corrugated substrate: buried nanoelectrodes, microprism substrates and azo-polymer-based sub-micrometer periodic surface structures, or by patterning the active layer into photonic crystal structures or surface relief gratings at the optical length scale, using soft lithographic techniques such as soft-embossing and PRINT.

Photoactive layer texturing methods based on soft lithography, have shown greater promise, but in these schemes absorption enhancement was not tailored to a desired spectral range. Furthermore, these techniques require additional processing of the active layer, which increases the risk of contamination and oxidation of the active layer surface, leading to Schottky barrier formation at the metal/polymer interface.

Moderate success has been achieved for patterned substrates targeting enhanced light absorption, with small molecules which can be thermally evaporated and conformal coating is achieved, irrespective of the underlying texture. However, challenges in obtaining a conformal coverage of solution processed polymers on these textured substrates, with coating technologies such as spin-coating, spray coating, inkjet printing, doctor blading, gravure and flexographic printing, remains a serious limitation of these periodic structures. Attempts at spin coating a BHJ layer onto textured substrates have led to over filling of the valleys and shunts at the crest, which can severely restrain the electrical performance of these OSCs, owing to high charge-carrier recombination and leakage current.

Embodiments of the present invention overcomes such problems and provides a structure and technique for conformal coating of polymer photovoltaic layers on light trapping textured substrates. These and other advantages of the invention, as well as additional inventive features, will be apparent from the description of the invention provided herein.

BRIEF SUMMARY OF THE INVENTION

One of the most critical issues in the design of semiconductor photovoltaic (PV) devices stems from the difference in the optimum length scales required for collection of the photo-generated carriers and for absorption of the incoming optical energy. In thinner structures, more photo-generated carriers can be collected before their annihilation through recombination. On the other hand, thick structures allow the incoming lightwave to penetrate deeper and ensure a higher degree of absorption of its photons. Traditionally, optical enhancements have involved use of anti-reflecting coatings coupled with a metallic back reflector. Solar cell efficiencies are improved by textured metallic back reflectors which scatter incident light through oblique angles, thereby increasing the path length of photons within the absorber layer. Such textured back reflectors exhibit intrinsic losses of light from plasmon modes within the absorber.

To overcome such problems, an embodiment of the present invention utilizes microscale textured, or microtextured, surfaces with tapered ends in a conceptually different way as compared with conventional back reflectors. In particular embodiments of the invention, ultrathin (e.g., less than 50 nanometers (nm)) layers of photovoltaic polymers are deposited on the microtextured and tapered electrodes. Upon encapsulation by another metallic/polymeric electrode, this architecture leads to highly efficient photovoltaic conversion. High efficiency arises from optimized light management in textures and tapered features on the order of the wavelength of absorbed light, and also from optimized electron-hole pairs and charged transport mechanisms in the ultrathin polymer films.

Unlike the nanoscale and macroscale approaches described in the Background, the microscale light-management architecture used in embodiments of the present invention is more powerful in terms of its efficacy for highly efficient solar cells. Due to the tapered ends of the microtextured templates, optical energy is highly enhanced and a high degree of absorption will take place even in a very thin photoactive organic film. This thin film will be thin enough so that electron-hole pairs are efficiently dissociated into free charges, and these resultant charges are efficiently transported to the external circuit. The improvement in power conversion efficiency that this design will enable is potentially much more than the competing approaches discussed in the Background above. Due to employment of a soft-lithography-based fabrication approach, our approach in embodiments of the invention is also scalable and relatively low-cost.

In embodiments of the present invention, the pitch and height of the textured substrate, adequate for conformal BHJ layer coating as well as absorption enhancement at the band edge of the active polymer, which in one embodiment is P3HT, is controlled. Moreover, the texture is preferably provided by photoresist lithography, which has played a key role in semiconductor industry microfabrication in last few decades and has undergone immense development to reduce processing cost and improve scalability, making this process viable for large scale production of grating based OSCs.

In some embodiments of the present invention, average doubling of absorption near the band edge (600 nm≤λ≤700 nm) of P3HT:PCBM due to the grating geometry is achieved. Efficiency improvements of 20%, which is ascribed to light trapping effect of these PR cells, is also achieved.

Other aspects, objectives and advantages of the invention will become more apparent from the following detailed description when taken in conjunction with the accompanying drawings.

BRIEF DESCRIPTION OF THE DRAWINGS

The accompanying drawings incorporated in and forming a part of the specification illustrate several aspects of the present invention and, together with the description, serve to explain the principles of the invention. In the drawings:

FIGS. 4a-4f are graphical illustrations of: (a) total (sum of zeroth and higher order) and scattered (higher order excluding zeroth order) reflections measured at normal incidence for the 2 μm pitch-300 nm height PR and planar cells; (b) external quantum efficiency of 2 μm PR and flat solar cells; (c) reflection, simulated absorption and equivalent quantum efficiency (EQE) ratios versus wavelength for planar and 2 μm PR cells; (d) simulated active-layer absorption for both PR and planar cells averaged over TE and TM polarizations (inset shows polarization averaged experimental and simulated total reflection for planar and 2 μm PR cells); (e) photocurrent dependence on pitch of the PR cells with a flat cell used as reference (stacking order and thickness of layers was kept same for PR and flat cells); and (f) effect of pitch-size on the dark current of PR cells at positive bias (the red line represents exponential fits, allowing determination of $J_0$)

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

Polymer-based photovoltaic devices have gained a lot of attention in the last decade due to their flexibility, solution-processibility, potential low cost, and roll-to-roll manufacturing capability. As discussed at length above, the performance of these devices is limited by several factors. The high energy band gap of the polymer materials poses a serious limitation on the capability to harvest lower energy photons from sunlight. Moreover the charge carrier mobility of the materials is also moderate which makes it necessary to keep the thickness of the active layer low. Thus there is a conflict between the higher optical absorption from thicker layer and the efficient transport of carriers, which has to be considered carefully to determine the optimal thickness of the active layer.

This conflict can be resolved in embodiments of the present invention by using a three-dimensional (3D) microscale textured grating shaped solar cell geometry. The solar cells are fabricated on gratings, which in certain embodiments are made from photoresist (PR), to give them 3D texture required for enhanced light absorption. In an embodiment of the invention, the gratings are periodic structures having a series of rails with top portions and spaces between the rails. In particular embodiments, the grating structure has a generally crenellated configuration. Introduction of texturing has a significant effect on overall power conversion efficiency of the devices. In an embodiment of the invention, a grating-based solar cell having a two-micron pitch showed improved power conversion efficiency over the flat solar cell. The improvement in efficiency is accomplished by homogeneous coverage with uniform thickness of the spin cast active layer, which is attributed to sufficiently high pitch and low height of the underlying PR gratings. Also, in a particular embodiment, a two-micron pitch texturing led to greatly suppressed reflection due to the efficient coupling of incident light into modes that are guided in the P3HT:PCBM active layer. In other embodiments, the pitch may be greater or lesser than two microns. In certain embodiments of the invention, the pitch is greater than one micron. In the particular embodiments of the invention, including those in which the grating pitch is two microns, the grating height is 300 nm. In alternate embodiments, the grating height is less than 500 nm.

Figure 1:
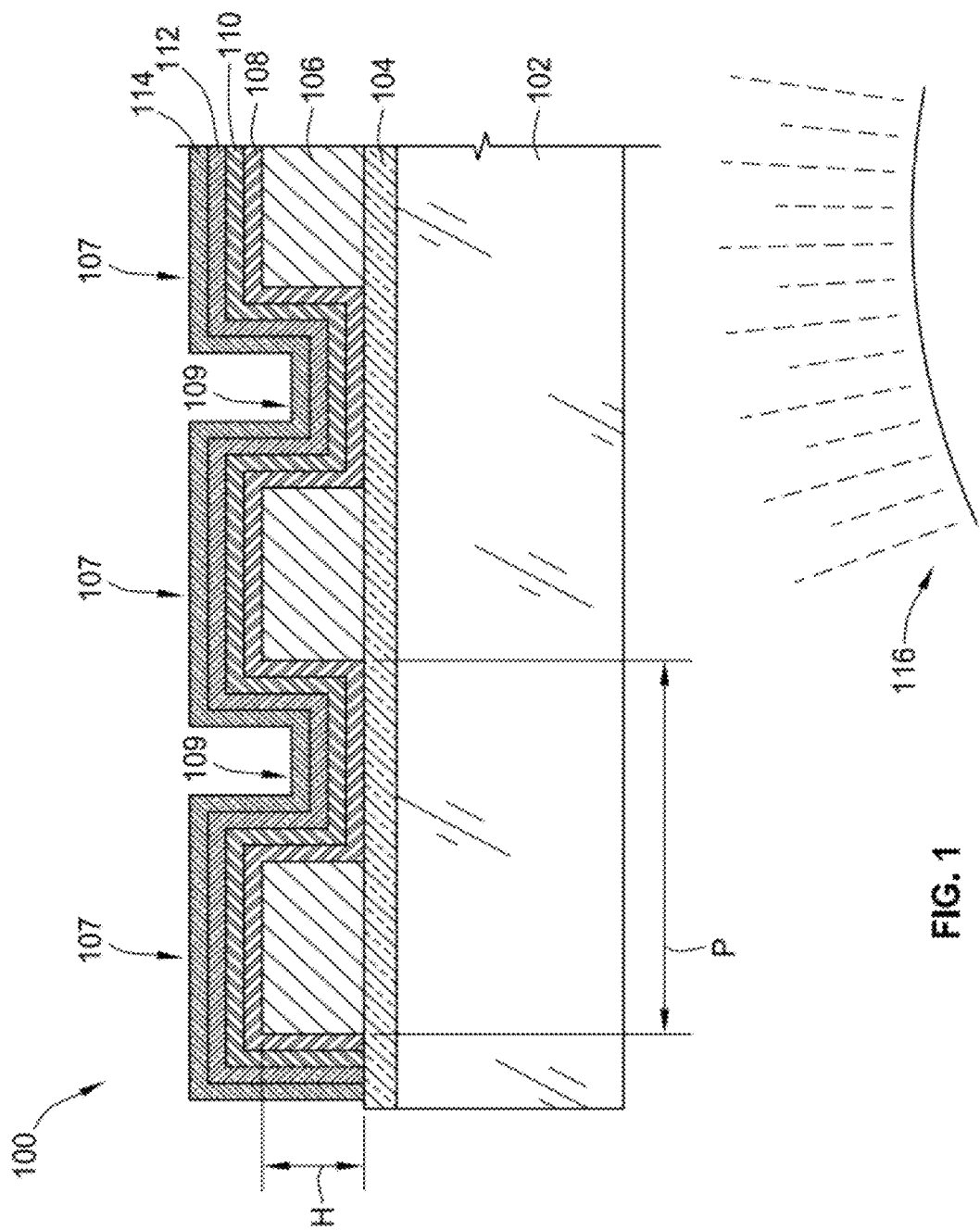
FIG. 1 is a simplified illustration of the structure of an embodiment of a photoresist (PR) grating based solar cell constructed in accordance with the present invention.

Turning now to FIG. 1, the structure of an embodiment of an organic solar cell (OSC) 100 having a textured grating is illustrated. A transparent substrate 102 has a first electrode 104 deposited thereon. In particular embodiments, the substrate 102 is glass, though it is envision that other suitable transparent materials, including plastic, may be used. Further, in more particular embodiments, the first electrode 104 is a layer of indium-tin oxide (ITO) disposed onto a first side of the glass substrate 102. A grating 106 is formed or deposited onto the layer of first electrode 104. The structure of the grating give the surface of the organic solar cell 100 a textured appearance. In the embodiment of FIG. 1, the periodic structure of the grating 106 is, in part, defined by a series of evenly-spaced rails having top portions 107 and having spaces 109 between the rails. In the embodiments described herein, the terms "first electrode 104" and "ITO electrode" may be used interchangeably. In embodiments of the invention, the grating 106 is made from a photoresist, and may be referred to herein as a photoresist grating. In a particular embodiment, the grating 106 is formed by depositing an evenly-spaced series of rails made of photoresist onto the surface of the first electrode 104. However, this is not intended to limit the grating 106 to photoresists, as it is envisioned that other suitable materials may be used to construct the grating 106.

In a particular embodiment, the photoresist grating 106 is layered with a layer of ITO 108 to facilitate hole collection and extraction. The layer of ITO 108 may be deposited by sputtering. In a particular embodiment, the thickness of the layer of ITO 108 is approximately 120 nm. However, in alternate embodiment, the thickness of the layer of ITO 108 ranges from 50 nm to 120 nm. In the embodiment of FIG. 1, a hole-conducting film 110, which in a particular embodiment is made from poly(3,4-ethylenedioxythiophene) (PEDOT) doped with poly(styrenesulfonate) (PSS) (hereinafter "PEDOT:PSS"), is layered over the layer of ITO 108. An active layer 112 is deposited onto the hole-conducting film 110. In a particular embodiment, the active layer 112 is comprised of an electron donor-acceptor blend of P3HT and PCBM. In alternate embodiments of the invention, the active-layer 112 is comprised of a donor-acceptor blend other than P3HT-PCBM. A second electrode 114 is deposited onto the active layer 112. In a particular embodiment, the second electrode 114 is made from aluminum. In a more particular embodiment, the thickness of the aluminum second electrode 114 is 100 nm. In alternate embodiments of the invention, the second electrode 114 is made from a metal other than aluminum, or, alternatively, from a metal alloy of suitable conductivity.

The organic solar cell 100 is thus adapted to receive incident light 116 through the glass substrate 102. The structure of the photoresist grating 106 and the subsequent layers of the solar cell discussed above then help convert the incident light 116 into usable electrical energy more efficiently than done in conventional organic solar cells, as will be explained in further detail below. The textured second electrode 114, which may be an aluminum metal layer scatters light along the plane dimension and increases the light travelling path inside the active layer 112 providing enhanced absorption due to a light-trapping mechanism.

In one embodiment of the present invention, a exemplary method of making photoresist (hereinafter "PR") gratings are made using laser interference holography with Lloyd's mirror setup on ITO glass slides. First AZ-hir 1075 PR is spin-coated onto a pre-cleaned ITO substrate at 4000 rpm for 30 second and then prebaked in an oven at 60° C. for approximately 30 minutes. The prebaked PR is exposed by sinusoidal interference patterns made with an argon laser (wavelength=364 nm) and post-baked at 110° C. for approximately one minute. Then it is developed in MIF 300 developer for 1 minute with gentle stir followed by distilled water rinse. The period of the grating pattern can be changed by changing the angle of incidence or the wavelength of the laser.

In another embodiment, an exemplary method of making organic solar cells (OSCs) 100 using PR gratings 106 is as follows. In the embodiment shown, the PR gratings 106 are formed or deposited onto ITO substrates, but to have good electrical connectivity between the active layer 112 and the ITO electrode 104, the ITO layer 108 is sputtered onto the PR gratings 106. In a particular embodiment, sputtering of the ITO layer 108 takes place at 20 W RF power in Argon at room temperature.

In another particular embodiment, the hole-conducting film 110 of poly(3,4-ethylenedioxythiophene) doped with poly(styrenesulfonate) (PEDOT:PSS) is spin-coated at 3000 rpm after UV-Ozone plasma exposure on ITO-sputtered PR gratings 106. In a more particular embodiment, the hole-conducting film 110 is annealed at 120° C. for approximately ten minutes on a hot plate to evaporate the remaining solvent. In at least one embodiment, the OSC 100 is transferred inside a glove box, for example, having Argon environment. In certain embodiments of the invention, the electron donor-acceptor blend in the active layer 112 has a 1:1 weight ratio. In particular embodiments, the P3HT concentration is 17 mg/ml in a dichlorobenzene solution. In a more particular embodiment, the electron donor-acceptor blend in the active layer 112 is deposited over the PEDOT hole-conducting film 110 via spin-coating at 600 rpm for approximately 60 seconds. Typically, after this spin-coating step, the OSC 100 is allowed to dry slowly in a sealed environment. In a further embodiment of the invention, the second electrode 114 is made from aluminum, and is formed by thermal evaporation on top of the active layer 112 of the organic solar cell 100.

In operation, light 116 is incident from the bottom of the OSC 100 (according to the orientation of FIG. 1) and travels through the transparent substrate 102 and first electrode 104 until it encounter the textured grating 106, which disperses the light throughout the active layer 112 to generate electrical current. The incident light 116 encounters the second electrode 114. In an embodiment, the second electrode 114 is a textured aluminum layer (textured due to the fact that it is deposited onto the grating 106) that causes the incident light 116 to scatter along the plane dimension and increases the light-travelling path inside the active layer 112 providing enhanced absorption due to this light-trapping mechanism.

In different embodiments of the present invention, various dimensions of gratings for conformal spin-coating of P3HT:PCBM active layer 112 may be used, and, these embodiment are compared to a generally flat OSC, i.e. an OSC without a PR grating, in the paragraphs below. In embodiments of the invention where the height of the grating 106 is restricted to a submicron level (300 nm in one embodiment), a conformal deposition was achieved. In this context, a conformal deposition is one that maintains a uniform thickness on the surface of the OSC 100, and thus appears textured due to the textured grating 106.

Figures 2A, 2B, 2C:
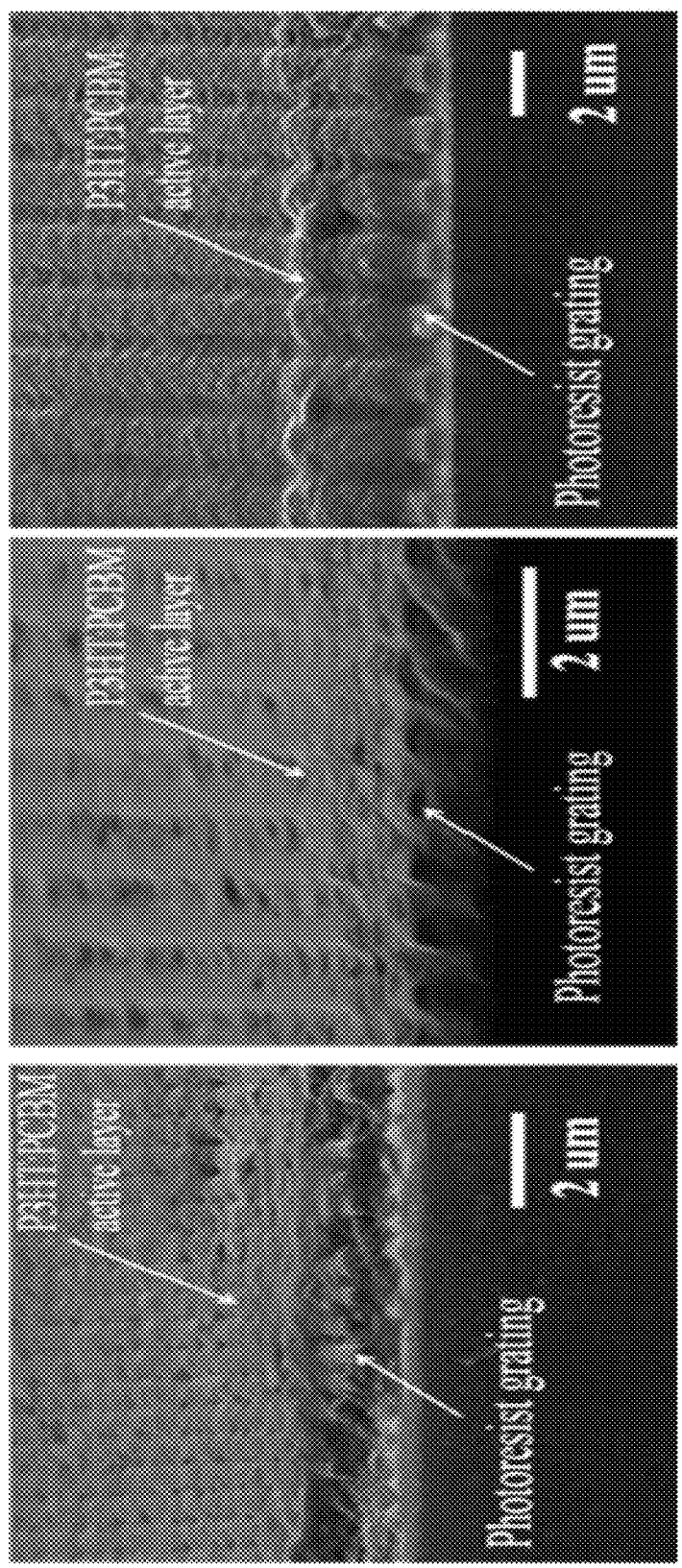
FIGS. 2a-2c are scanning electron micrograph cross-sections of: (a) a 600 nm-pitch PR-grating-based plasma physical vapor deposition (PPVD); (b) a one-micron (1-μm)-pitch PR-grating-based PPVD; and (c) a two-micron (2-μm)-pitch PR-grating-based (PPVD) showing a bulk heterojunction blend layer on top of the PR grating.

FIG. 2 shows scanning electron micrograph cross-section and atomic force microscopy (AFM) height images of the PR gratings (300 nm height) coated with P3HT:PCBM active layer. In one embodiment, a pitch of two microns enables uniform spreading and realization of the conformal coating (see FIG. 2c), which can be attributed to the sufficiently high pitch and low height of the base PR gratings 106 used. It is more difficult to achieve a perfectly conformal coating as the pitches decreases. This is illustrated in the photos of the OSC 100 with pitches of one micron and 600 nm, as shown in FIGS. 2a and 2b.

Figure 3A:
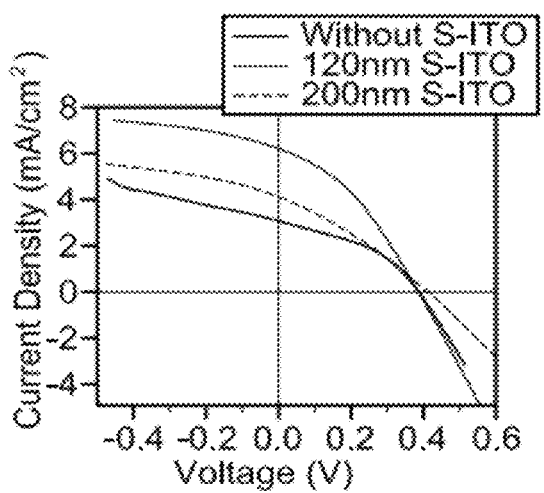
FIGS. 3a-3c are graphical illustrations of: (a) current density versus voltage plots; (b) external quantum efficiency versus wavelength of 600 nm pitch-200 nm height PR solar cell devices, on varying sputtered indium tin oxide (S-ITO) thicknesses; and (c) transmission spectra of 200 nm-thick S-ITO and 300 nm thick PR film.
Figure 3B:
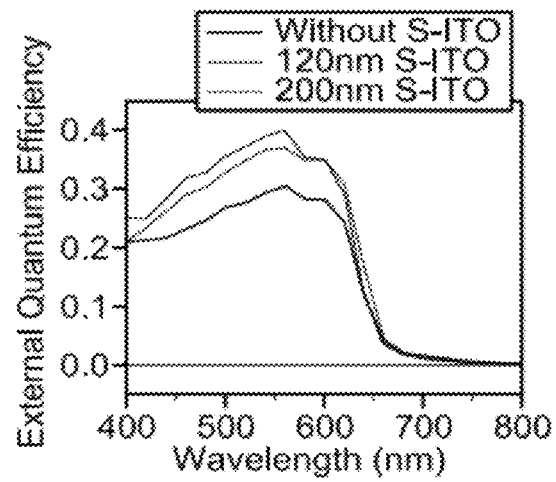
Figure 3C:
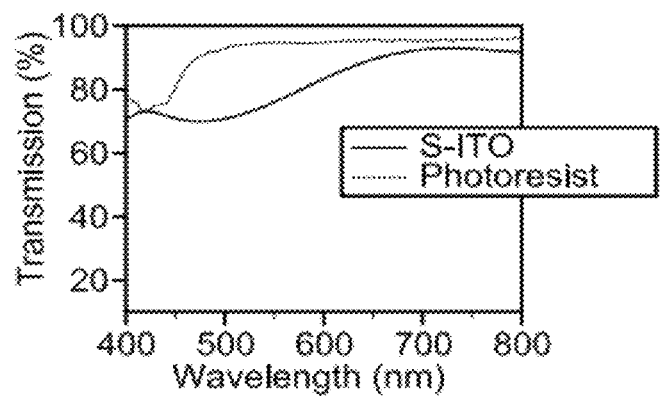

Turning now to FIGS. 3a-3c, which are graphical illustrations showing the relationship between efficiency and wavelength, and between current density and voltage. In an embodiment of the invention, the ITO layer 108 is sputtered on top of PR gratings 106 to provide path for hole collection and extraction, from the active layer 112 to the bottom ITO electrode 104. FIG. 3(a) shows photocurrent versus voltage curves of a grating based solar cell with 600-nm-pitch and 200-nm-height having different sputtered ITO (S-ITO) thicknesses. Embodiments without the sputtered ITO layer exhibit the least short circuit current density due to poor charge collection as a result of longer charge transport path way, contributing to recombination losses. Upon sputtering a 120-nm-thick ITO layer, the device series resistance decreases due to the formation of continuous conductive pathway of S-ITO, for better hole transport from active layer to the underlying ITO anode, thus mitigating electrical losses. In an organic solar cell with a 200-nm-thick S-ITO layer, optical absorption increases in the S-ITO layer and hence the photon flux reaching the active layer is reduced, imparting, in this particular embodiment, a lower current density to the device as compared to the device with the 120-nm S-ITO. The above observation is also suggested by comparing the external quantum efficiency (EQE) of the two devices having S-ITO thicknesses of 120 nm and 200 nm, for incident light with wavelengths in the range of 400 nm-600 nm, where the S-ITO is more light-absorbing (see FIGS. 3b and 3c).

Figure 4D:
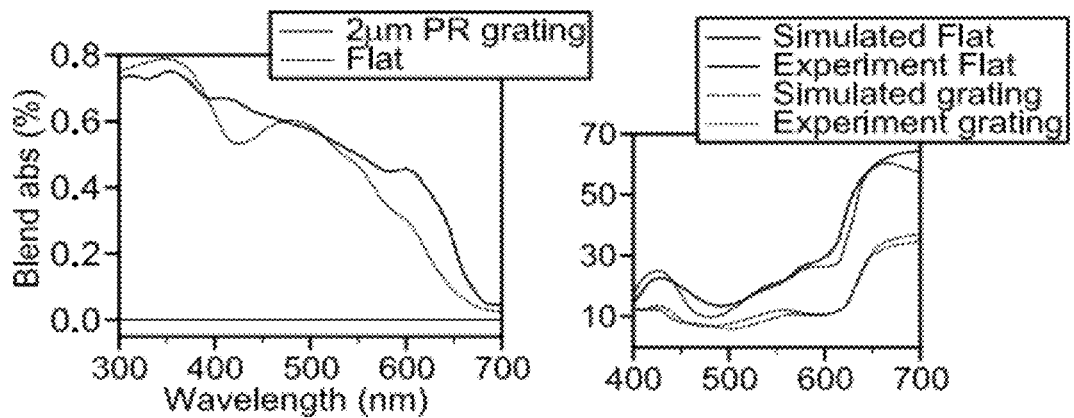

FIG. 4(a) is a graphical illustration showing the total (sum of zeroth and higher order) and scattered (higher order excluding zeroth order) reflection measured at normal incidence for the 2 µm pitch-300 nm height PR and planar cells. Total reflection is greatly suppressed in the case of the PR-grating solar cell. Total reflection measurements also show significant interference oscillations 402 that appear in flat film devices while PR-grating devices show relatively flat smoother reflection in the range of 400 nm-600 nm. The observed oscillations 402 in the flat PPVD solar cell are basically Fabry-Perot interference, arising from the incompletely absorbed incident light inside the active layer interfering with the reflected light from the glass side of the device. The interference oscillations are reduced for the PR grating PPVD, suggesting that very little light escapes after reflection from the aluminum second electrode, and thus their absence corroborates light-trapping effects.

As a result of negligible transmission, the reflection (R) yields an approximation to the absorption (A) using A=100−R. For wavelengths longer than 550 nm, there is a much stronger absorption in the PR-grating solar cell as evidenced by the reduced reflection (see FIG. 4a). Specifically, it can be seen from FIG. 4a that the absorption is enhanced by 2.5 times for the PR-grating solar cell over the planar solar cell for incident light in which λ=600 nm.

The graphical illustration of FIG. 4b shows measured external quantum efficiency for a two-micron PR grating solar cell and a flat solar cell. In certain embodiments, a two-micron-pitch grating exhibits substantial enhancement in EQE over the flat structure at wavelengths greater than 550 nm. This observation is supported by significant scattered (higher order) reflection from the 2-µm-pitch PR-grating solar cell for λ>550 nm (FIG. 4a). Due to the periodic structure of the cathode (second electrode), incident light reaching the backside of the grating can be diffracted backward according to the following equation:

$$m\lambda = n_{active} p(\sin \theta_i + \sin \theta_d) \qquad (1)$$

where m is the diffraction order, λ is the wavelength of incident light, $n_{active}$ is the refractive index of the active film, p is the period of grating, and $\theta_i$ and $\theta_d$ are incidence and diffraction angles, respectively. A constant $n_{active}$ is considered to be 2 in the spectral wavelength range between 300 and 700 nm for simplification. Then, in the case of normal incidence, for 600 nm≤λ≤700 nm, m can take values of 0, ±1, ±2, ±3, ±4 and ±5, because $\sin \theta_d \leq 1$ and p=2 µm. Because the total reflection and hence the zeroth order reflection is reduced by the two-micron grating structure, the diffraction occurs and the diffracted light at high orders can be bent by 90°; therefore the optical path length is increased considerably, providing a light-trapping mechanism.

For the short-wavelength region (below 500 nm) where the extinction coefficient of P3HT:PCBM is high, all the light loss can be attributed to the light reflection since its absorption depth (~100 nm) is smaller than the active layer thickness of approximately 150 nm. Therefore, the enhancement of EQE (see FIG. 4b) at short wavelengths (420-500 nm) is imputed by the reduced reflection of the PR-grating solar cell in this wavelength range. This lowering of reflection is the result of path length increment of the backscattered light from the aluminum second electrode, for example, inside the photoactive layer. The above determination is supported in FIG. 4c by the distinct peak 404 in the reflection ratio (planar solar cell versus 2 µm-pitch PR-grating solar cell) curve for wavelengths range: 400 nm-500 nm (see FIG. 4c).

The above mentioned approximation of A=100−R is a measure of total absorption where losses in all internal layers are included. The optical absorption in each internal layer is altered by the grating due to its corrugated structure relative to the planar cell. This will cause changes in the electromagnetic field in layers that also absorb light but do not produce photocurrent, such as indium tin oxide (ITO) and PEDOT:PSS. Hence only a first approximation to the photoactive absorption is achieved by comparing reflection. Therefore, optical absorption is individually quantified in all the layers by solving electromagnetic wave equations on the entire defined geometry.

For planar solar cells, simulations can be performed using optical models based on a one-dimensional transfer matrix formalism for normal light incidence. This approach however is not suitable for the optical modeling of grating-based organic solar cells, since the grating pitch is of the order of the wavelength of the incident light, which leads to complex diffraction and interference effects that have to be included in the model. The finite element model included in COMSOL MULTIPHYSICS has been used to perform the simulations, accounting for the two-dimensional geometry and wavelength dependence of dielectric functions for materials.

The physical dimensions of the PR-grating solar cell used for the simulations may be obtained from measured scanning electron microscope (SEM) values. A good fit between the measured and simulated total reflection at normal incidence for planar solar cells and 2-μm-pitch PR-grating solar cells is obtained, as shown in inset of FIG. 4d. The model is used to calculate absorption in the P3HT:PCBM active layer that will yield photovoltaic current in the external circuit. Active layer absorption is plotted for both PR-grating and planar solar cells in FIG. 4d, and is averaged over TE and TM polarizations.

In particular embodiments of the invention, significant absorption improvement using the PR grating geometry versus the flat geometry is obtained for incident light in the wavelength range of 600 nm-700 nm. In certain embodiments, the P3HT has a band gap of approximately 600 nm, and, in a particular embodiment, the absorption coefficient drops quickly when the light wavelength is above approximately 600 nm. Specifically, a 2.6-fold absorption enhancement is achieved at λ=640 nm for the two-micron PR-grating solar cell relative to the planar solar cell. In particular embodiments, this results in an average doubling of absorption near the band edge (600 nm≤λ≤700 nm). These data suggest that textured geometry of PR-grating solar cells can enhance the light-trapping effect significantly even for the absorption of photons below the band gap.

The graphical illustration of FIG. 4c further confirms the argument that improvement in EQE and absorption is owing to light concentrator effect by showing that the wavelengths at which the reflection from the grating is suppressed as compared to flat (i.e. peaks in the Reflectance ratio—flat:grating) correspond to the peaks 406 of the EQE enhancement ratio (EQE grating:EQE flat). Furthermore, simulated blend absorption ratio (grating:flat) follows the same trend as EQE ratio versus wavelength (FIG. 4c), confirming that the difference in EQE is related primarily to optical effects rather than increased area or other electrical enhancements (such as excitonic dissociation, electric field between electrodes, charge transport etc).

Figure 4E:
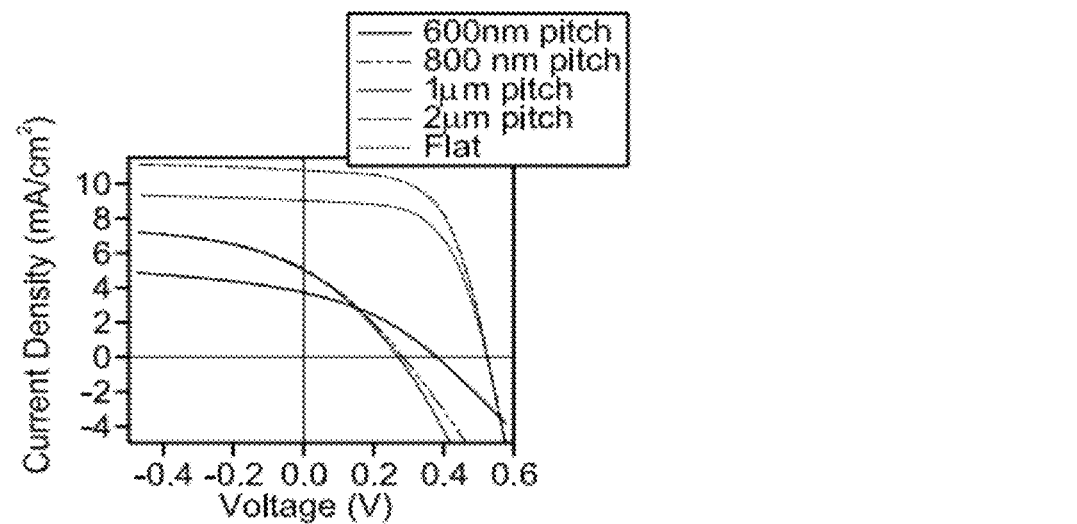

The graphical illustration of FIG. 4e shows a comparison of current density versus voltage characteristics for flat and PR-grating solar cells. Owing to conformal coating (see FIGS. 2a-2c), particular embodiments of the organic solar cell 100, fabricated with a 2-μm pitch and a PR grating, outperformed the planar solar cell and embodiments of organic solar cells using gratings with pitches less that two microns. For an embodiment of the 2-μm-pitch PR-grating solar cell 100, most of the increase in the power conversion efficiency comes from an increased $J_{sc}$ (short circuit current) through the application of periodic structures rather than through control of the open-circuit voltage and fill factor. An embodiment of the 2-μm-pitch PR-grating solar cell 100 exhibited 20% enhancement in short-circuit current density, which is in agreement with the EQE measurements, as shown in FIG. 4b. This implies that texturing of the substrate induces more photo-generated charge carriers due to stronger absorption by the active layer 112, resulting from an increase in the optical path length and from light-trapping effects.

Figure 4F:
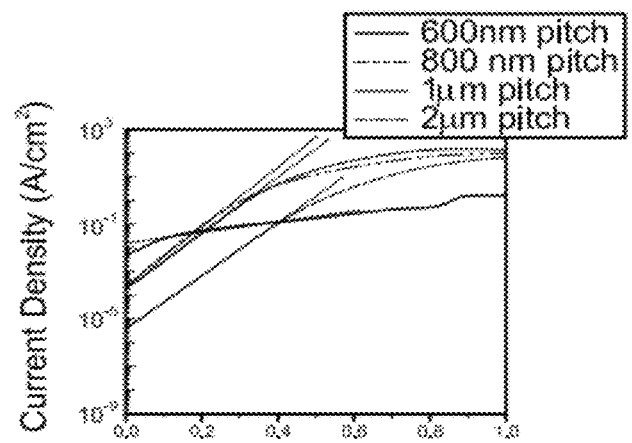

The graphical illustration of FIG. 4f shows dark current at positive bias for PR-grating solar cells 100 with different pitches. The ideal diode equation (2) is used to explain and fit the dark current-voltage ($J_{inj}(V)$) curves. The dark saturation current in equation (2), $J_0$ is the intercept with the 0 V line of an exponential fit of the dark current $J_{inj}(V)$.

$$J_{inj}(V) = J_0\left(\exp\left(\frac{qV}{kT}\right) - 1\right) \quad (2)$$

$J_0$ values may be determined from exponential fits of dark I-V curves which are related to open circuit voltage, $V_{oc}$ by equation (3), where $J_{sc}$ is the short circuit current which has same order of magnitude for all pitch sizes. As seen from FIG. 4f, $J_0$ (i.e., the intercept of the exponential fit on 0 V line) is least for 2-μm-pitch PR-grating solar cells 100, which explains highest $V_{oc}$ among PR-grating solar cells 100, from equation (3). The least dark current and highest $V_{oc}$ for the 2-μm-pitch PR-grating solar cell 100 further confirms the conformal nature of the active layer 112.

$$V_{oc} = \frac{kT}{q}\ln\left(\frac{J_{sc}}{J_0} + 1\right) \quad (3)$$

Figure 5A:
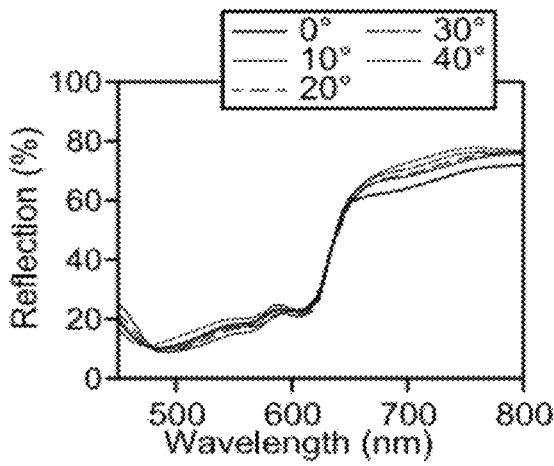
FIGS. 5a-5d are graphical illustrations of angular-dependent unpolarized total (sum of zeroth and higher order) reflection for (a) planar and (b) 2 μm pitch-300 nm height PR cells; and variation of (c) p-polarized (parallel to grating) and (d) s-polarized (perpendicular to grating) total reflection with incident angle for 2 μm pitch-300 nm height PR cell.
Figure 5B:
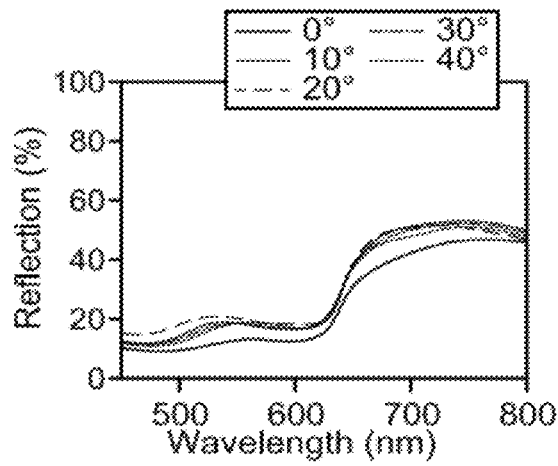
Figure 5C:
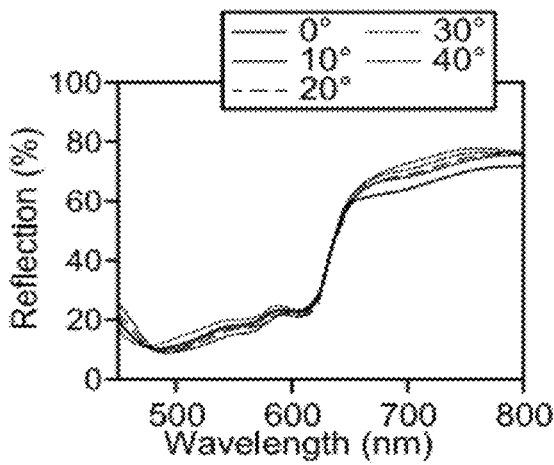
Figure 5D:
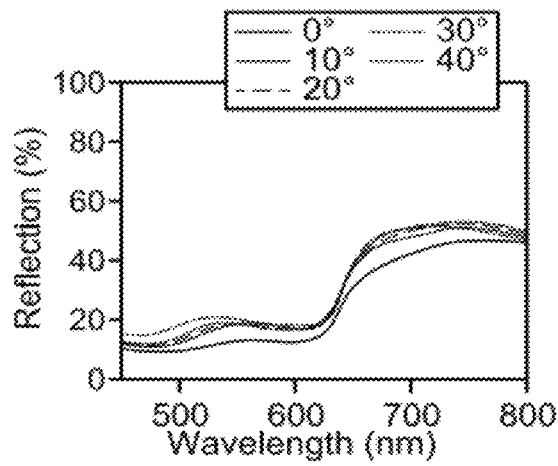

For solar cells in a practical environment where sunlight can be quite diffused, it is important to evaluate the absorptance over a wide range of incident angles. Comparing the graphical illustrations of FIGS. 5a and 5b reveals that the 2-μm-pitch-300-nm-height PR-grating solar cell 100 has a distinct advantage over the planar solar cell in terms of absorbed light, even at higher incident angles. For certain embodiments of the invention, upon increasing the incident angle of light, the total reflection from the PR-grating cell 100 increased for incident light with wavelengths in the range of 500 nm-600 nm (see FIG. 5b), and this contribution comes primarily from the s-polarized reflection (see FIG. 5d). In certain embodiments, P-polarized reflection does not vary significantly with the incident angle of light in the absorption range of P3HT:PCBM blend, i.e., (400 nm-650 nm).

Thus with implementation of a textured substrate for deposition of the active layer 112 in accordance with embodiments of the invention, it is possible to achieve higher absorption and improve the charge transport with a lower active layer thickness than could be achieved in conventional organic solar cells.

The optical behavior of microscale textured solar cells has been studied using reflection measurement and is compared with planar geometry. Embodiments of the invention show increased absorption due to microscale texturing of the second electrode 114 surface (the texturing due to the textured grating 106). The increase in absorption is reflected in the 20% improvement in power conversion efficiency of these solar cells. As a result, there is an implication for textured geometries such that a thinner active layer 112 is not only competitive with flat PPVD solar cells having a thicker active layer in terms of absorption, but embodiments of the invention also exhibit significantly improved carrier transport properties. Thus, embodiments of the present invention offer a potential solution for the classic tradeoff between optical and electronic scales in organic based solar cells.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A solar cell, comprising:
   a first electrode deposited onto a transparent substrate;
   a grating material deposited directly onto the first electrode;
   an active layer deposited onto the grating, the active layer configured to convert photonic energy into electrical energy; and
   a second electrode deposited onto the active layer;
   wherein the grating is configured to enhance light absorption by the active layer.

2. The solar cell of claim 1, further comprising a transparent, electrically-conducting layer disposed between the grating and the active layer, the transparent, electrically-conducting layer provided to improve the electrical connection between the active layer and the first electrode.

3. The solar cell of claim 2, wherein the transparent, electrically-conducting layer comprises indium tin oxide.

4. The solar cell of claim 3, wherein the thickness of the transparent, electrically-conducting layer ranges from 50 nanometers (nm) to 120 nm.

5. The solar cell of claim 3, wherein the transparent, electrically-conducting layer is a sputtered transparent, electrically-conducting layer.

6. The solar cell of claim 2, further comprising a hole-conducting film disposed between the transparent, electrically-conducting layer and the active layer.

7. The solar cell of claim 6, wherein the hole-conducting film comprises poly(3,4-ethylenedioxythiophene) (PEDOT) doped with poly(styrenesulfonate) (PSS).

8. The solar cell of claim 1, wherein the grating is a periodic structure having a generally crenellated configuration.

9. The solar cell of claim 8, wherein a distance between a first edge of one high portion and a corresponding first edge of an adjacent high portion is greater than one micron.

10. The solar cell of claim 8, wherein a distance between a first edge of one high portion and a corresponding first edge of an adjacent high portion is approximately two microns.

11. The solar cell of claim 8, wherein a difference in height between a high portion and a neighboring low portion is approximately 300 nm.

12. The solar cell of claim 8, wherein a difference in height between a high portion and a neighboring low portion is less than 500 nm.

13. The solar cell of claim 8, wherein the grating is formed by depositing an evenly-spaced series of rails onto a surface of the first electrode.

14. The solar cell of claim 13, wherein each of the series of rails is made from photoresist.

15. The solar cell of claim 1, wherein the active layer comprises a bulk heterojunction organic photovoltaic material.

16. The solar cell of claim 15, wherein the active layer comprises a blend of poly(3-hexylthiophene) (P3HT) and [6,6]-phenyl-C61-butyric acid methyl ester (PCBM).

17. The solar cell of claim 1, wherein the first electrode comprises a layer of indium tin oxide.

18. The solar cell of claim 1, wherein the second electrode comprises a layer of aluminum.

19. The solar cell of claim 18, wherein a thickness of the second electrode is approximately 100 nm.

20. An organic solar cell, comprising:
   a transparent substrate having a transparent electrode attached thereto;
   a periodic grating structure deposited directly onto the transparent electrode and disposed between the transparent electrode and a conductive layer;
   an organic photovoltaic layer formed onto the conductive layer; and
   a second electrode attached to the organic photovoltaic layer;
   wherein the periodic grating structure is configured to increase the power conversion efficiency of the solar cell by scattering incident light.

21. The organic solar cell of claim 20, wherein the periodic grating structure has a pitch of approximately two microns and a height of less than 500 nanometers.

22. The organic solar cell of claim 21, wherein the periodic grating structure comprises a series of rails attached to a surface of the transparent electrode, and wherein each of the series of rails is made from photoresist.

23. The organic solar cell of claim 20, further comprising a hole-conducting film disposed between the organic photovoltaic layer and the conductive layer, wherein the conductive layer comprises a layer of indium-tin oxide having a thickness in the range of 50 nm to 120 nm.

24. The organic solar cell of claim 23, wherein the hole-conducting film comprises PEDOT doped with PSS, and wherein the organic photovoltaic layer comprises a blend of poly(3-hexylthiophene) (P3HT) and [6,6]-phenyl-C61-butyric acid methyl ester (PCBM).

25. The organic solar cell of claim 20, wherein the transparent electrode comprises a layer of indium tin oxide, and wherein the second electrode comprises a metal or metal alloy.

* * * * *